Jan. 3, 1967 J. J. STEINMETZ, JR., ET AL 3,296,506

HOUSED SEMICONDUCTOR DEVICE STRUCTURE WITH
SPRING BIASED CONTROL LEAD
Filed Nov. 12, 1964

INVENTORS
John J. Steinmetz, Jr.
& William H. Walker, Jr.
BY
F. E. Browder
ATTORNEY

United States Patent Office 3,296,506
Patented Jan. 3, 1967

3,296,506
HOUSED SEMICONDUCTOR DEVICE STRUCTURE WITH SPRING BIASED CONTROL LEAD

John J. Steinmetz, Jr., Monroeville, and William H. Walker, Jr., Greensburg, Pa., assignors to Westinghouse Electric Corporation, East Pittsburgh, Pa., a corporation of Pennsylvania Filed Nov. 12, 1964, Ser. No. 410,660
1 Claim. (Cl. 317—234)

This invention relates to controlled semiconductor devices, and more particularly to a controlled semiconductor device having a solderless compression connection between the control electrode of the device and the control lead.

In prior art semiconductor devices of the compression assembled type, a semiconductor wafer having the desired junctions therein is prepared. This wafer comprises an anode electrode, a cathode electrode and a gate or control electrode. The anode and cathode connections are usually made to the wafer by means of compression; however, in these prior art devices the gate of control connection, which is an ohmic contact, is usually made to the control electrode lead by soft solder. This soft solder process of connecting a gate lead to the control electrode involves pre-timing the gate of control electrode, applying rosin flux to the gate of control electrode, and soldering the gate of control lead to the gate of control electrode by heating the gate electrode to a temperature high enough to melt the solder and form a good joint. This usually requires heating the entire semiconductor wafer to a temperature of approximately 280° C. to 300° C., then the joint is cooled and the rosin flux residue is washed away with trichloroethylene. This method of attaching a gate or control lead to the gate electrode of the semiconductor wafer is unsatisfactory since many rejects are obtained due to the solder not wetting the gate electrode. This procedure also often cracks or completely destroys the semiconductor wafer due to the thermocycling of the semiconductor wafer when the gate or control electrode is heated to a temperature high enough to form the solder joint. This process also is objectionable because it is practically impossible to completely clean all of the surfaces which become contaminated with the rosin flux during the soldering operation. If all of the rosin flux is not completely cleaned away, any flux remaining will cause the semiconductor device to deteriorate and fail.

It is an object of this invention to provide an improved semiconductor device wherein the above-mentioned objections to the prior art devices are eliminated.

It is another object of this invention to provide a controlled semiconductor device having a solderless gate or control lead connected to a gate electrode.

It is a further object of this invention to provide an improved semiconductor device wherein all of the electrode connections to a semiconductor wafer are maintained by compression.

It is still a further object to provide an improved cathode electrode-control electrode contact assembly for use in controlled semiconductor devices.

Figure 1:
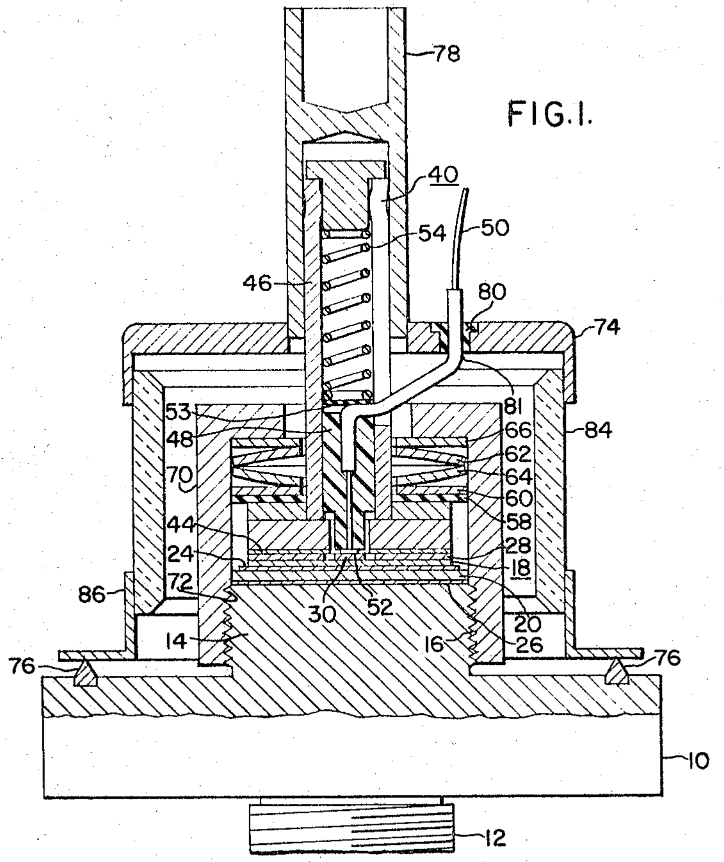
Figure 2:
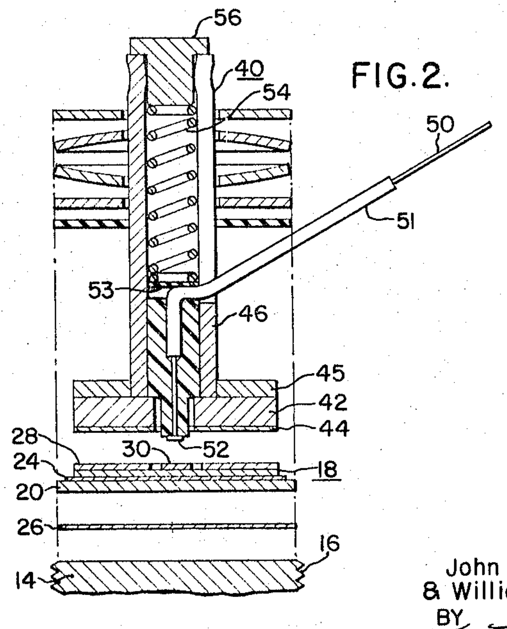

These and other objects of this invention will be apparent from the following description taken in connection with the accompanying drawing, in which:

FIGURE 1 is a vertical section of a compression assembled semiconductor device as provided by this invention; and FIG. 2 is an enlarged fragmentary exploded sectional view showing the details of the cathode and gate control connection of FIGURE 1.

Throughout the description which follows, like reference characters refer to like elements in the various figures of the drawing.

In FIGURE 1, there is shown a control semiconductor device which is compression assembled in accordance with the teachings of this invention. The device shown in FIGURE 1 comprises a massive metal member 10, which member 10 may be made of copper, brass, aluminum or any other suitable conducting material. The member 10 has at its lower end a screw-threaded portion 12 for assembling the device into electrical apparatus. The upper side of the member 10 is provided with a pedestal portion 14. The pedestal portion 14 has screw threads 16 thereon.

A semiconductor wafer 18 has a molybdenum, tungsten or tantalum support plate 20 soldered thereto by a layer of aluminum 24. The semiconductor wafer 18 has been formed with the desired junctions therein by any of the methods well known in the art. The semiconductor wafer 18 may be of the PNP, NPN, PNPN, NPNP or any other desired type having three or more contacts. The molybdenum plate 20 is placed on top of the pedestal 14 with a layer or wafer of silver or gold 26 positioned between the plate 20 and the top of the pedestal 14.

A contact layer of gold alloy 28 is provided by any of the methods known in the art on the upper surface of the wafer 18 to provide a cathode contact to the wafer 18. A gate or control electrode contact 30 is also provided on the upper side of the wafer 18.

Contact is made to the cathode contact 28 and the gate contact 30 by a cathode-gate subassembly 40. The cathode-gate subassembly 40 comprises a molybdenum washer 42 having a silver or gold layer 44 fused thereon. A hollow cathode connector 46 extends upwardly from the washer 42. An insulating plug 48 is slidably mounted inside the hollow tube 46. A gate or control lead 50 extends through a slot in the side wall of the hollow tube 46 and down through the center of the slidable insulating plug 48 and terminates in a button-shaped contact member 52. Gate lead insulation 51 is placed over the gate lead 50 and the lower end of the insulation 51 is sealed in the plug 48. Pressure is maintained on the button-shaped contact member 52 by means of a coil spring 54 which is positioned inside the tubular member 46. A mica washer 53 is positioned between the gate lead insulation 51 and the spring 54 to protect the gate lead insulation 51 against wear and damage by the spring 54. The spring 54 is maintained under compression by a plug 56 which fits tightly into the upper end of the tubular member 46. The spring 54 maintains a constant pressure between 3 to 5 pounds on the button-shaped contact member 52. A copper washer 45 is soldered to the top side of molybdenum washer 42.

To assemble the device of FIGURE 1, the silver or gold layer 26 is placed on the pedestal 14, the semiconductor wafer 18 is placed on top of the layer 26 on the pedestal 14, then the cathode-gate subassembly 40 is placed into position on top of the semiconductor wafer 18 with the silver or gold layer 44 in contact with the cathode electrode 28. Then a metal washer 58 is placed over the tubular member 46 of the cathode-gate subassembly 40 and an insulating washer 60 is placed on top of the metal washer 58, next a pair of convex spring washers 62 and 64 are placed over the tubular member 46 and on top of the washer 60 and finally another metal washer 66 is placed over the tubular member 46 and in contact with the spring washer 62. Next a cup-shaped member 70 having internal threads at 72 is placed over the tubular member 46 and the internal threads 72 are screwed down onto the threaded portion 16 of the pedestal 14 until a desired predetermined pressure is applied to the cathode contact 28 and the anode contact 24. It has been found from experience that this pressure is in the order of from 1000 to 2000 pounds. A pressure of 1500 pounds has been found to be particularly satisfactory for the devices of the type illustrated. It is seen that as the cup-shaped member 70 is screwed down onto the threaded portion 16 of the pedestal 42, the spring 54 is compressed and this spring forces the button-shaped contact member 52 on the end of the gate or control lead 50 firmly into engagement with the gate electrode 30 on the wafer 18. The contact between the button-shaped contact member 52 and the gate or control electrode 30 is an ohmic contact and the required pressure to maintain a good electrical and thermal contact between the button-shaped contact member 52 and the electrode 30 is easily determined by proper selection of the coil spring 54.

After the device has been assembled in the manner described above, the entire assembly is encapsulated with a housing member. This housing comprises a ceramic creep insulator 84 having a lower header 86 and the upper header 74. The lower header is welded to the member 10 as indicated at 76 and the upper header has attached thereto a hollow stem member 78 which fits over the hollow member 46 and is electrically connected to the hollow member 46 by rolling or compression in some known manner. The stem member 78 provides means for attaching a cathode lead to the device. The gate lead, as seen from FIGURE 1, passes through a slot in the side of the tubular member 46 and is sealed through the upper header 74 by means of an insulator 80.

In FIG. 2, there is shown an enlarged exploded view of the cathode-gate subassembly 40 of FIGURE 1. In FIG. 2, it is readily seen that when the cathode-gate subassembly 40 is in disassembled relationship with respect to the semiconductor wafer 18 that the button-shaped contact member 52 projects below the silver or gold layer 44. However, when the device is assembled as illustrated in FIGURE 1, the plug member 48 is forced up into the tube 46 and compresses the spring 54. In assembled position, as shown in FIGURE 1, the plug 48 is forced completely up into the tubular member 46 and the button-shaped contact member 52 is maintained in contact with the gate or control electrode 30 of the wafer 18 by the energy stored in the compressed spring 54. It is emphasized that the spring 54 applies a continuous and constant force to the control electrode 30 to maintain a good thermal and electrical contact between the electrode 30 and the button-shaped contact member 52.

It is seen from the above description that this invention has provided a controlled semiconductor device wherein the anode, cathode and gate or control connections are made and maintained entirely by compression. It is not necessary to use flux or solder in assembling the device after the junctions have been formed in the semiconductor wafer, neither is it necessary to thermocycle the semiconductor wafer, after the junctions have been formed therein, in order to assemble the wafer into a device. It is also seen that all electrode connections are made to the wafer without the use of solder or flux.

From the foregoing, it is seen that the device described herein provides an improved semiconductor device over the devices provided by the prior art wherein the gate or control lead is soldered to the gate or control electrode on the semiconductor wafer.

While this invention has been shown in only one form, it will be obvious to those skilled in the art that it is not so limited, but is susceptible of various changes and modifications without departing from the spirit thereof.

We claim as our invention:

A semiconductor device comprising:

(1) a wafer of semiconductor material having two substantially parallel major opposed surfaces,
(2) a control electrode and a cathode electrode,
(3) said control electrode and said cathode electrode being affixed to one of said major surfaces,
(4) an anode electrode,
(5) said anode electrode being affixed to the other of said major surfaces,
(6) said anode member being in electrical and thermal contact with a metal base member,
(7) said metal base member having a pedestal portion,
(8) said pedestal portion having a plurality of screw threads disposed about the sides of the pedestal,
(9) a cathode connector connected to said cathode electrode,
(10) said cathode connector comprising a hollow member,
(11) a control lead connected to said control electrode,
(12) said control lead being disposed within said hollow cathode connector at the point at which it is joined to said control electrode,
(13) an inverted cup-shaped member,
(14) said inverted cup-shaped member having a plurality of screw threads disposed about its inside wall,
(15) said inverted cup-shaped member being joined to said pedestal portion by said screw threads,
(16) the walls of said inverted cup-shaped member forming an aperture in its top portion,
(17) said hollow cathode connector with said control lead disposed therein being disposed through said aperture,
(18) an upper header disposed over and spaced from said inverted cup-shaped member,
(19) the walls of said upper header forming a first and a second aperture therein,
(20) said hollow cathode connector being disposed through said first aperture,
(21) the side walls of said hollow cathode connector forming an aperture in that portion of said hollow cathode connector disposed between said inverted cup-shaped member and said upper header,
(22) said control lead disposed through said aperture in said hollow cathode connector and through said second aperture in said upper header,
(23) and spring means disposed within said hollow cathode connector above the aperture in the connector through which the control lead is disposed, said spring means applying a pressure to said control lead to maintain electrical contact between said control lead and said control electrode.

References Cited by the Examiner

UNITED STATES PATENTS

| | | | |
|---|---|---|---|
| 3,155,885 | 11/1964 | Marino et al. | 317—234 |
| 3,192,454 | 6/1965 | Rosenheinrich et al. | 317—234 |
| 3,221,219 | 11/1965 | Emeis et al. | 317—234 |

JOHN W. HUCKERT, *Primary Examiner.*

A. M. LESNIAK, *Assistant Examiner.*